(12) United States Patent
Chanda et al.

(10) Patent No.: US 7,473,636 B2
(45) Date of Patent: Jan. 6, 2009

(54) METHOD TO IMPROVE TIME DEPENDENT DIELECTRIC BREAKDOWN

(75) Inventors: Kaushik Chanda, Fishkill, NY (US); James J. Demarest, Fishkill, NY (US); Ronald G. Filippi, Wappingers Falls, NY (US); Roy C. Iggulden, Stoughton, MA (US); Edward W. Kiewra, Verbank, NY (US); Vincent J. McGahay, Poughkeepsie, NY (US); Ping-Chuan Wang, Hopewell Junction, NY (US); Yun-Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 11/306,825

(22) Filed: Jan. 12, 2006

(65) Prior Publication Data

US 2007/0158851 A1    Jul. 12, 2007

(51) Int. Cl.
*H01L 21/4763* (2006.01)

(52) U.S. Cl. ........................ 438/626; 438/639; 438/645; 438/648; 257/E21.584

(58) Field of Classification Search .................. 438/639
See application file for complete search history.

(56) References Cited

U.S. PATENT DOCUMENTS

| | | | |
|---|---|---|---|
| 5,789,315 A | 8/1998 | Besser et al. | |
| 6,093,600 A | 7/2000 | Chen et al. | |
| 6,107,159 A | 8/2000 | Chuang | |
| 6,245,666 B1 | 6/2001 | Ko et al. | |
| 6,252,292 B1 | 6/2001 | Brintzinger et al. | |
| 6,312,985 B1 | 11/2001 | Wu et al. | |
| 6,316,352 B1 | 11/2001 | Wu et al. | |
| 6,376,368 B1* | 4/2002 | Jung et al. | 438/639 |
| 6,380,078 B1 | 4/2002 | Liu et al. | |
| 6,387,190 B1 | 5/2002 | Aoki et al. | |
| 6,420,258 B1 | 7/2002 | Chen et al. | |
| 6,440,840 B1 | 8/2002 | Chen | |
| 6,440,861 B1 | 8/2002 | Liu et al. | |
| 6,455,372 B1 | 9/2002 | Weimer | |
| 6,528,412 B1* | 3/2003 | Wang et al. | 438/628 |
| 6,534,458 B1 | 3/2003 | Kakizawa et al. | |
| 6,544,584 B1 | 4/2003 | Arrington et al. | |
| 6,559,007 B1 | 5/2003 | Weimer | |

(Continued)

FOREIGN PATENT DOCUMENTS

EP        1 249 866 A2      10/2002

(Continued)

OTHER PUBLICATIONS

Article: Noguchi, et al., "Cu-Ion-Migration Phenomena and its Influence on TDDB Lifetime in CU Metallization", IEEE, 2003, pp. 287-292.

*Primary Examiner*—Stephen W Smoot
(74) *Attorney, Agent, or Firm*—Lisa Jaklitsch; Hoffman Warnick LLC

(57) ABSTRACT

In the back end of an integrated circuit employing dual-damascene interconnects, the interconnect members have a first non-conformal liner that has a thicker portion at the top of the trench level of the interconnect; and a conformal second liner that combines with the first liner to block diffusion of the metal fill material.

14 Claims, 1 Drawing Sheet

U.S. PATENT DOCUMENTS

| | | |
|---|---|---|
| 6,559,543 B1 | 5/2003 | Dunham et al. |
| 6,613,664 B2 | 9/2003 | Barth et al. |
| 6,667,533 B2 | 12/2003 | Daubenspeck et al. |
| 6,699,396 B1 | 3/2004 | Drewery |
| 6,828,299 B2 | 12/2004 | Yang et al. |
| 2004/0094839 A1 * | 5/2004 | Fitzsimmons et al. ....... 257/758 |
| 2004/0198062 A1 | 10/2004 | Ye et al. |

FOREIGN PATENT DOCUMENTS

| | | |
|---|---|---|
| JP | 11-238797 | 8/1999 |

* cited by examiner

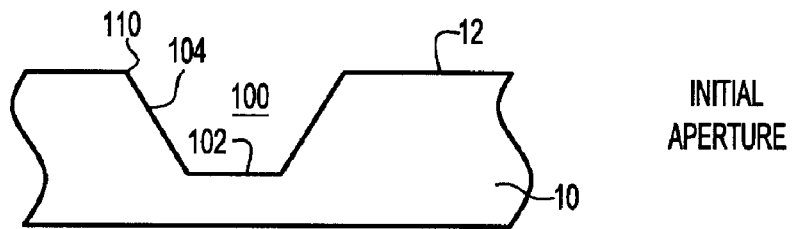
FIG. 1 — INITIAL APERTURE
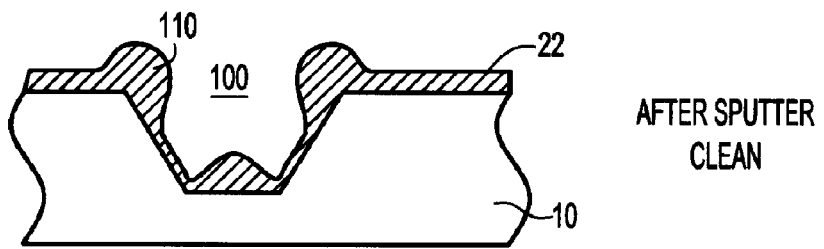
FIG. 2 — AFTER SPUTTER CLEAN
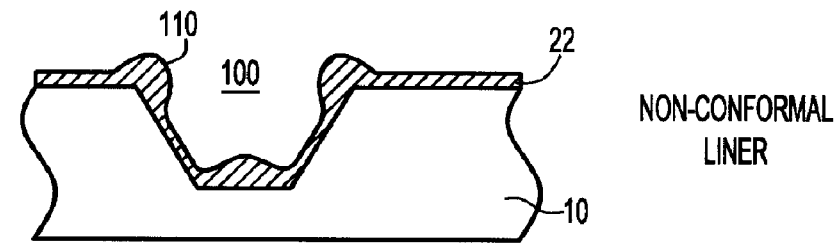
FIG. 3 — NON-CONFORMAL LINER
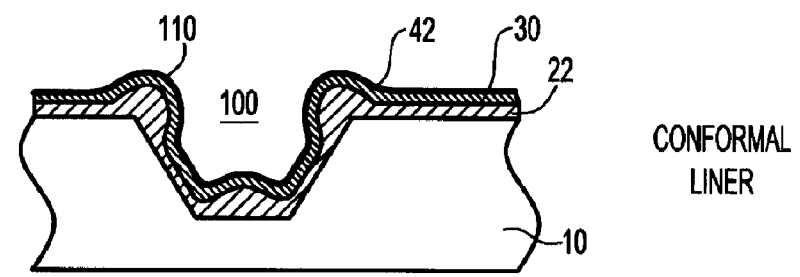
FIG. 4 — CONFORMAL LINER
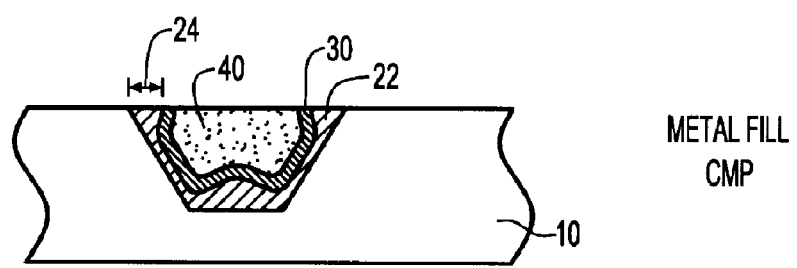
FIG. 5 — METAL FILL CMP

METHOD TO IMPROVE TIME DEPENDENT DIELECTRIC BREAKDOWN

TECHNICAL FIELD

The field of the invention is that of forming connections between circuit elements in the back end of line (BEOL) integrated circuits, in particular forming damascene lines that are resistant to reliability failures that develop over time.

BACKGROUND OF THE INVENTION

The damascene process is a process in which metal interconnect lines are delineated and isolated in dielectrics by means of chemical mechanical polishing (CMP). A dual damascene process is a similar process in which metal interconnect lines and vias (i.e., conductor-filled channels) are defined independently in photolithography and etch but metallized simultaneously.

Time Dependent Dielectric Breakdown (TDDB), in which a weakness in an insulator develops over time into a failure under a bias condition, is a significant source of reliability fails in the interconnection of devices in integrated circuits.

In the particular case of copper interconnect structures, the majority of TDDB fails occur in the upper portion of the copper line, often caused by a weak liner near the interface between the copper fill and the dielectric cap over the line.

Often times TDDB fails occur in the metal interconnections. For example, short circuits may be caused by residual metal (e.g., copper (Cu)) or liner materials (e.g., titanium (Ti), titanium nitride (TiN), tantalum (Ta), tantalum nitride (TaN), tungsten (W), etc.) that is not removed from the dielectric material by the CMP during the damascene or dual damascene process.

It is known that TDDB reliability can be improved by increasing the thickness of the liner material that confines the copper within the interconnect structure, but a uniform liner thickness increase on all covered surfaces reduces the amount of copper in the structure for a given interconnect dimension and is not acceptable.

One known failure mode is the presence of Cu (and/or Ta) particles between adjacent metal lines. It is known that such particles can be left by incomplete chemical-mechanical polishing (CMP) of the damascene interconnect. If the interconnect diffusion barrier liner were thicker in the transverse dimension (perpendicular to the interconnect member axis and parallel to the surface of the interlevel dielectric (ILD) that contains the interconnect) the metal particles would have to travel a larger distance before they could cause a short circuit between adjacent lines and reliability would be improved.

As noted above, the simple solution of thickening the liner uniformly on all covered surfaces is not acceptable because of the constant need to reduce the dimension of circuit elements.

The art could benefit from an interconnect structure that maintained an acceptable conductivity by supplying a sufficient cross section of copper material while also maintaining sufficient thickness of liner to reduce this failure mode.

SUMMARY OF THE INVENTION

The invention relates to an interconnect member in the BEOL of an integrated circuit that has a liner with a non-uniform thickness, the liner being sufficiently thick on the sides of the member to contain the interconnect metal and being thicker at the top corners of the member to suppress metal diffusion out of liners along a transverse axis through an interface.

A feature of the invention is a dual liner comprising a non-conformal first layer and a conformal second layer, the thicknesses of the two layers being selected such that the combined thickness on the aperture sidewalls is sufficient to confine the metal fill material and the combined thickness on the top corners is sufficient to suppress diffusion of metals out of liners.

BRIEF DESCRIPTION OF THE DRAWINGS

FIG. 1 shows a cross section of an aperture in an interlevel dielectric for forming a damascene interconnect member.

FIG. 2 shows a cross section after the deposition of the non-conformal liner layer.

FIG. 3 shows the same cross section after on optional step of sputtering the first layer of liner to selectively reduce its thickness.

FIG. 4 shows the cross section after the deposition of the second conformal liner layer and the deposition of a copper seed layer by atomic layer deposition (ALD).

FIG. 5 shows the cross section after deposition of the copper fill material and CMP.

DETAILED DESCRIPTION

FIG. 1 shows an initial step in forming a damascene interconnect conductive line, referred to generally as an interconnect member, extending perpendicular to the plane of the paper. An aperture 100 is formed in an interlevel dielectric 10, the aperture having top corners 110 intersecting the top surface 12 of dielectric 10, a bottom surface 102 and sidewalls 104. The slope of the sidewall is defined by the etch process during the trench opening in the dielectric layer. A steeper slope will yield thicker liner at the top corners relative to that on the sidewall. A damascene trench with vertical walls would also work. The particular etching process will depend on the material of the dielectric and is conventional, well known to those skilled in the art.

A non-conformal first liner 22 is deposited, e.g. by physical vapor deposition. The parameters of the deposition are chosen such that material is deposited preferentially on the top corners 110, which is an aspect of deposition that is ordinarily a drawback, since it tends to cause voids in later deposition steps. Illustratively, the non-conformal liner is TiN, Ti, Ta or TaN, deposited in conventional physical deposition chambers, e.g. as manufactured by Novellus Systems and Applied Materials, according to processes well known to those skilled in the art, but typically excluding process features such as an in-situ sputtering which enhance conformality.

FIG. 2 shows the result of this process, with the additional material on corners 110 indicated.

FIG. 3 shows the result of an optional step of sputter cleaning that tapers the corners and allows a thicker film to be deposited in that region without increasing the number of voids in the interior fill in the conductor deposition step. This is done to reduce the thickness of the liner material on the sidewalls and the bottom of aperture 100. Those skilled in the art are aware that it is desirable to have the thickness of the liner on the sidewalls the minimum amount that will act as a bulk copper diffusion barrier blocking diffusion of the copper metal fill material in order to have the maximum amount of copper, and thus the minimum resistivity, in the interconnect, for a given cross section.

The dimensions of the liner will need to satisfy two constraints. The thickness on the sidewalls must be sufficient to act as a bulk copper diffusion barrier and the thickness along a transverse axis parallel to the surface 12 of the dielectric and extending left-right in the Figures must also be sufficient to provide an effective surface diffusion barrier for copper atoms, ions and particulates after the CMP step and prior to passivation.

Referring now to FIG. 4, there is shown the result of a second liner deposition, this time with parameters set for a conformal liner 30. Illustratively, the deposition is performed in conventional chemical or physical vapor deposition chambers, e.g. as manufactured by Novellus Systems and Applied Materials, according to processes well known to those skilled in the art but, in the case of physical vapor deposition, typically employing process features such an in-situ sputtering which enhance conformality. The conformal liner thickness is in the range 5 to 100 nm depending on the dimensions of the interconnect, with smaller interconnects typically having thinner liners.

The conformal liner may be the same or a different material or sequence of materials from that of the first material. For example the non-conformal material may be physical vapor deposition (PVD) TaN and the conformal liner IPVD (ionized PVD) Ta. TaN is superior to Ta as a Cu diffusion barrier but has higher resistivity. By preferentially depositing TaN in the corners where the TDDB concern is greatest but utilizing Ta as the primary barrier along the remainder of conductor surfaces, an optimized combined liner is obtained.

Also shown in FIG. 4 is copper seed layer 42, denoted by a thicker line on the outer surface of the conformal liner 30. Preferably, layer 42 is deposited by a conformal deposition process, typically based on PVD processes but also including atomic layer deposition and chemical vapor deposition (CVD) processes, such as to provide coverage on the lower sides of corners 110.

FIG. 5 shows the cross section after the completion of the copper fill and CMP to bring the top of the interconnect in line with the top surface 12 of the ILD. The copper deposition step is conventional, well known to those skilled in the art.

Bracket 24 in FIG. 5 illustrates the increased thickness of the material on the top corner, which is the parameter that prevents metal particles from diffusing outside the interconnect line, potentially causing short circuits to adjacent lines.

The structure shown in FIG. 5 may be described as having a pair of thickened upper corners that together extend over a range of 10% - 25% of the total width of the distance between the outer corners of liner 22. For example, in a BEOL using ground rules for the 90 nm node of the technology roadmap, the combined width included in both brackets 24 is about 10-25% of 120 nm. Those skilled in the art will appreciate that a greater width on the corners will provide more protection against TDDB, subject to an increased danger of forming voids in the metal line. The preceding range is based on current technology and may be changed as the technology changes.

An alternative embodiment of the invention may be practiced with the non-conformal layer 22 being an insulator, such as oxide or nitride. In that case, the non-conformal layer, e.g. nitride, would be deposited in conventional chemical or physical vapor deposition chambers, e.g. as manufactured by Novellus Systems and Applied Materials, according to processes well known to those skilled in the art.

In this embodiment, non-conformal liner 22 is an insulator such as oxide or nitride, which also provides the required diffusion barrier to confine the copper fill. The conformal liner 30 would then preferably be selected from the group of conductive refractory materials such as Ti, TiN, Ta or TaN and deposited with appropriate parameters to provide the required conformal property as is known in the art.

The optional steps of sputter cleaning and depositing a seed layer by ALD may be used or not, as in the previous embodiment.

Other embodiments of the invention may include a sacrificial hardmask, which is used to protect against damage on the top of the dielectric surface during CMP. It is put down on top of dielectric (10) before trench opening. The mask is then patterned to define the trench locations, serving as a mask during a subsequent etch of the dielectric to open the trench. Layers of liners are then deposited with the same steps, followed by seed and metal (e.g. Copper) deposition. After CMP to define the metal line, the sacrificial mask is then removed.

Another alternative would be used if the ILD is porous. In that case, it is necessary to have the liner stay in the trench and avoid having the liner leak into the porous dielectric, so that the material of the non-conformal liner must be one that does not leak into the ILD and the deposition process must be such that the non-conformal profile is achieved.

For porous ILD, it is important to keep conductive liner material from getting into the pores and potentially bridging adjacent interconnects. With this invention, the first liner is deposited with non-conformal process, and thus the liner will not get into pores but only seals the pore openings. The second liner (conformal process) can then be deposited safely.

It should be understood that although the invention is primarily intended for copper (Cu) as well as Cu alloys for the metallization, the method can be implemented with other interconnect materials, such as aluminum (Al), gold (Au), silver (Ag) and alloys thereof.

While the invention has been described in terms of a single preferred embodiment, those skilled in the art will recognize that the invention can be practiced in various versions within the spirit and scope of the following claims.

What is claimed is:

1. A method of forming an interconnect member in an interlevel dielectric in the back end of the line portion of an integrated circuit comprising the steps of:
    forming an aperture extending along an interconnect axis in said interlevel dielectric, said aperture having a bottom surface, top corners and aperture sidewalls connecting said bottom surface with said top corners;
    depositing a non-conformal liner layer in said aperture such that said non-conformal liner has a first thickness along said sidewalls and a second thickness, larger than said first thickness, at said top corners;
    depositing a conformal liner in said aperture, said conformal liner having a conformal thickness on said sidewalls that combines with said first thickness to form a combined liner sidewall thickness, wherein said conformal liner selected from the group comprising Ta and TaN;
    filling said aperture with a metal interconnect material; and
    planarizing said interconnect member, whereby the distance along a transverse axis perpendicular to said interconnect axis between said metal fill and said top corners is greater than a corresponding distance along a transverse axis between said metal fill and said aperture sidewalls.

2. A method according to claim 1, in which said non-conformal liner is a conductor.

3. A method according to claim 2, in which said non-conformal liner is a from the group comprising Ti, TiN, Ta and TaN.

4. A method according to claim 3, further comprising a step of depositing a seed layer of metal fill by atomic layer deposition.

5. A method according to claim 2, in which said interlevel dielectric is porous and said non-conformal liner seals pore openings in said interlevel dielectric.

6. A method according to claim 2, further comprising a step of depositing a seed layer of metal fill by atomic layer deposition.

7. A method according to claim 2, further comprising a step of depositing a sacrificial hardmask on the top of said interlevel dielectric before said step of forming an aperture in said interlevel dielectric.

8. A method according to claim 1, in which said non-conformal liner is an insulator.

9. A method according to claim 8, in which said non-conformal liner is selected from the group comprising oxide and nitride.

10. A method according to claim 1, in which said interlevel dielectric is porous and said non-conformal liner seals pore openings in said interlevel dielectric.

11. A method according to claim 1, further comprising a step of depositing a seed layer of metal fill by atomic layer deposition.

12. A method according to claim 1, further comprising a step of depositing a sacrificial hardmask on the top of said interlevel dielectric before said step of forming an aperture in said interlevel dielectric.

13. A method according to claim 12, farther comprising a step of depositing a seed layer of metal fill by atomic layer deposition.

14. A method according to claim 1, in which said aperture is a dual damascene aperture.

* * * * *